United States Patent [19]

Berger et al.

[11] Patent Number: 5,079,112
[45] Date of Patent: Jan. 7, 1992

[54] DEVICE MANUFACTURE INVOLVING LITHOGRAPHIC PROCESSING

[75] Inventors: Steven D. Berger, Chatham; John M. Gibson, Morristown, both of N.J.

[73] Assignee: AT&T Bell Laboratories, Murray Hill, N.J.

[21] Appl. No.: 390,139

[22] Filed: Aug. 7, 1989

[51] Int. Cl.$^5$ .................................. G03F 9/00
[52] U.S. Cl. ........................... 430/4; 430/296; 430/311; 430/395; 430/396; 430/494; 430/966; 430/967; 430/5
[58] Field of Search ............ 430/4, 296, 311, 395, 430/396, 494, 966, 967, 5

[56] References Cited

U.S. PATENT DOCUMENTS

| | | | |
|---|---|---|---|
| 3,105,761 | 10/1963 | Foris | 430/494 |
| 3,630,598 | 12/1971 | Little, Jr. | 350/404 |
| 3,748,468 | 7/1973 | Hartman | 250/396 |
| 3,862,843 | 1/1975 | Lerner | 430/496 |

OTHER PUBLICATIONS

Ludwig Reimer, "Transmission Electron Microscopy", Springer Verlag, Berlin, Heidelberg, New York, 1984, pp. 186–198.

*Primary Examiner*—Charles L. Bowers, Jr.
*Assistant Examiner*—Thomas R. Neville
*Attorney, Agent, or Firm*—G. S. Indig

[57] ABSTRACT

Fabrication of devices of micron and submicron minimum feature size is accomplished by lithographic processing involving a back focal plane filter. A particularly important fabrication approach depends upon mask patterns which produce images based on descrimination as between scattered and unscattered radiation.

3 Claims, 3 Drawing Sheets

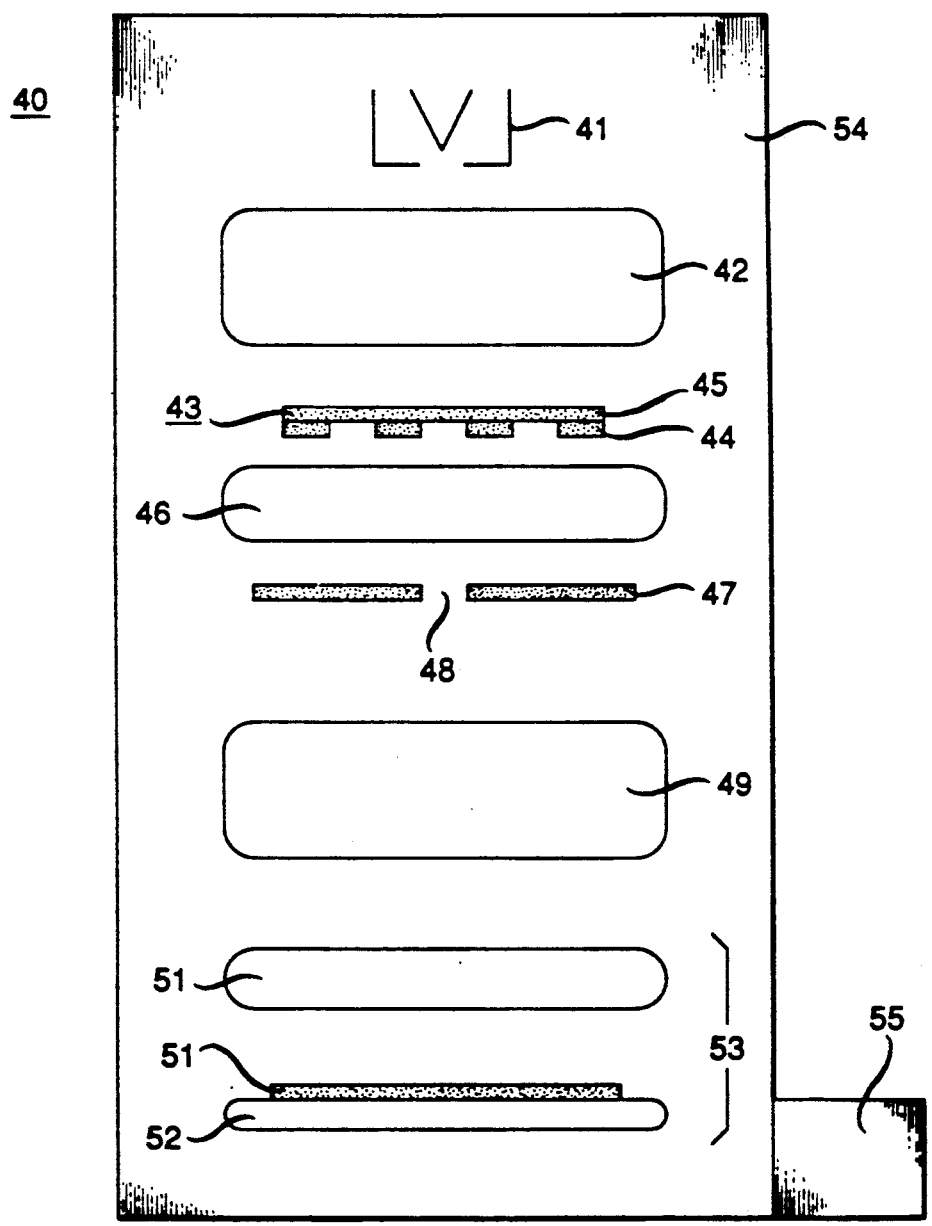

DEVICE MANUFACTURE INVOLVING LITHOGRAPHIC PROCESSING

BACKGROUND OF THE INVENTION

Technical Field

The invention is concerned with the fabrication of devices by procedures including lithographic delineation. Contemplated devices may be discrete or integrated but have the common characteristic of being dependent upon feature size or spacing which may be as small as a micrometer or less. Semiconductor integrated circuits are critically dependent on small dimensions, and future generations are expected to benefit by the invention. Prospectively, integrated circuits will increasingly include optical devices, and these too will be advanced by the inventive teaching.

Terminology

The arts involved, commercial as well as scientific, make use of a variety of terms which are not consistently applied. It is convenient to define terms as used in this document. Following definitions are in terms of electron lithography—the area of prime importance as well as that of greatest need of definition. Terms as applied to X-ray or other electromagnetic radiation are analogous.

Electron Beam Projection Lithography

Lithographic system entailing simultaneous illumination of at least a significant portion of a mask with an electron beam to result in a projection image of such portion. Contemplated systems depend upon imaging by accelerated illuminating electrons as altered by transmission through the mask. The term is not intended to include imaging by unaccelerated low energy electrons as directly produced upon photo illumination of a photo cathode.

Described systems permit mask-to-image reduction to minimize effects of imperfections such as pattern edge roughness or simply to provide for needed miniaturization. For many purposes, reduction may be up to tenfold or greater. One-to-one imaging, as well as magnification, are also permitted.

Mask

A fabrication tool consisting of "blocking" regions and "transparent" regions which when illuminated by electron radiation yields an image defined by relatively low and high electron intensities, respectively. While a mask is generally deliberately fabricated for contemplated use, the possibility that it may constitute or include a naturally occuring pattern such as that of a crystallographic lattice is contemplated.

Blocking

Mask regions resulting in a degree of electron attenuation in the image which is of consequence in device fabrication, e.g. with regard to resist or other imaging material.

Transparent

Mask regions resulting in a degree of electron attenuation in the image which is small relative to blocking regions in terms of device fabrication, e.g. with regard to resist or other imaging material.

Absorbing

The characteristic, generally discussed in terms of blocking regions, entailing a degree of reduction in transmitted energy relative to illuminating energy.

Scattering

The angular change in direction experienced by electrons during transmission through a material, generally in terms of beam electrons during passage through a mask. Scattering may be elastic or inelastic and under many conditions both are manifested. Inelastic scattering, most evident in material which absorbs at concerned electron energies, may result in "chromatic aberration"—a change in wavelength with implications on focal distance and, therefore, in image quality.

For ease of description reference is made to "scattered" and "unscattered" energy. In principle, transmitting energy experiences some degree of scattering, however, small, upon passage through any real material—presence of a scattering feature, however far from the transmitting energy, in principle, results in some change in direction. Terminology is defined in terms of lithographically significant effects—e.g. "unscattered" may connote the range up to the maximum scatter angle selectively passed through some subsequent aperture.

Edge Scattering

This term has reference to electrons which are transmitted through the interface between blocking and non-blocking mask regions regardless of mechanism. For the usual situation for which the interface is nominally vertical (perpendicular to the mask plane), affected electrons are traveling in directions outside the beam limit. Scattering may be elastic or inelastic, may be the consequence of but a single event, or may be the result of two or more scattering events. Edge diffraction as ordinarily regarded, while a contemplated contributor to edge scattering, is ordinarily of small magnitude and accordingly of little or no lithographic significance (for contemplated e-beam lithography in which wavelength is small relative to minimum feature size).

Back Focal Plane Filter

Filter having two or more areas of differing transmissivity for electrons of the same velocity. As used herein, choice of area is dependent upon scattering. In an embodiment, the filter provides for selective transmission of "unscattered" (including low-angle scattered) electrons and takes the form of an absorbing member provided with an aperture of size determined by desired scattering angle limitation. Alternatively, the filter may be of design to selectively transmit electrons scattered to values within any desired scattering angle range. Placement of the filter is in any event at or in the proximity of the back focal plane of the objective lens or in the proximity of any conjugate plane in the imaging system. The terminology "back focal plane filter" as used herein is intended to encompass any such filter placement. Aperture size (at least for usual round on-axis apertures) is described in terms of maximum angle of acceptance for incoming radiation. (Mathematically, the tangent of this angle is equal to the radius of the aperture divided by the focal length of the associated lens.)

Imaging Material

Material within which the projection image is produced. In general, a transitory material e.g. "resist" is contemplated although the material may be retained in the fabricated device—as modified or unmodified due to image exposure.

Minimum Feature Size

As used herein this is the dimension of the smallest feature or spacing between features routinely produced as measured on the device. As discussed, this is the dimension generally used in device description; e.g. reference to "1 megabit chip", generally the present state of the art semiconductor chip, represents a minimum feature size of ~1 $\mu$m-usually the gate size of any included field effect transistor.

A number of other terms are used in the literature. While of complex and sometimes varying definition, such terms generally scale with minimum feature size. "Design rule" to many is synonymous. "Minimum line width" while defined in somewhat different terms, is a near-synonym. All such terminology and other dimensional terminology as well, as reported in the literature, is to be interpreted very carefully.

Transmission

Intensity of irradiating electrons in image regions corresponding with transparent mask regions as normalized relative to such intensity as incident on the mask.

Image Contrast

The difference in intensity of irradiating electrons as between image regions corresponding with blocking and transparent mask regions normalized to such intensity in image regions corresponding with transparent mask regions.

EDGE ACUITY

The distance over which contrast falls to one-half the image contrast as measured at the boundary between image regions corresponding with blocking and transparent mask regions.

DESCRIPTION OF THE PRIOR ART

Art of consequence is concerned with fabrication of devices which involves one or more lithographic delineation procedures. Most significant devices in this category to date are semiconductor devices although procedures have been otherwise applied, and still other forms of devices are of prospective interest. State-of-the-art semiconductor Integrated Circuits are now fabricated to minimum feature size of ~1 $\mu$m. Such devices use a variety of lithographic procedures designed to yield positive or negative images to bring about selective processing, e.g. etching, implantation, diffusion, deposition, etc. Design and process evolution as well as likely directions to be taken for next-generation devices are described in "Semiconductor Lithography Principles, Practices and Materials", W. M. Moreau, Plenum Press, New York, 1988.

A typical process yielding ICs one centimeter across containing up to a million devices built to minimum feature size of ~1 $\mu$m depends upon exposing and developing a resist layer by illumination with near ultraviolet radiation (e.g. wavelength of ~0.25 $\mu$m) by means of an absorbing type mask. Both proximity printing and projection printing find use. Considerable thought and experimentation worldwide are directed to future generation ICs. Near-term minimum feature size reduction (to minimum feature size of ~0.5 $\mu$m) is expected to depend upon similar systems based on shorter wavelength illumination in the near ultraviolet spectrum. Requisites such as optics design and resist formulation, are at an advanced stage.

A following generation, down to minimum feature size of ~0.35 $\mu$m, is not so well advanced. Some believe that lithographic delineation will depend upon shorter wavelength radiation in the deep ultraviolet spectrum.

Generations after that, devices fabricated to minimum feature size of less than 0.35 $\mu$m, and those of minimum feature size at or below 0.2 $\mu$m are already under active study. Mask fabrication approaches are at a very early stage of development. Operability of devices built to such specifications is established on the basis of fabrication entailing direct electron beam writing. (This technique, "direct write", is characterized by relatively low throughput, and is not expected to satisfy desire for large quantity production e.g. for memory devices.)

It is recognized that significant commercial realization of devices in this category will rely upon further advances in mask fabrication of devices. It is clear that wavelength limitations of ultraviolet radiation now in use make it unsuitable for imaging. While use of mask-to-image reduction permits passage of such radiation through the mask, it cannot be used to define minimum features smaller than its wavelength. Reliable production with reasonable yield is believed to require still further reduction in wavelength, to some fraction of minimum feature size. For 0.2 $\mu$m minimum features, radiation of wavelength of 500 Å (0.05 $\mu$m) or smaller is desired. Prospective mask manufacture in this last category has generally contemplated use of electromagnetic radiation in the X-ray spectrum.

Development of a suitable X-ray delineation approach has been difficult. Nevertheless, intense worldwide activity, while recognizing the many obstacles, shows progress. Major problems include limited source brightness, unavailability of X-ray optics, and poor absorption. Most advanced systems depend upon synchrotron sources.

The present state of development of X-ray optics results in most efforts to date taking the form of proximity printing (which in turn gives rise to the need for very close spacing between mask and exposure medium). As an example, use of X-ray wavelengths of about 10 Å typically requires mask-to-substrate spacing of about 10 $\mu$m for resolution of 0.2 $\mu$m features. Danger of mask breakage is significant for this spacing. While such a facility has been demonstrated, it used sources, masking approaches and other conditions not readily adapted to commercial practice. For example, exposure times in such demonstrations have typically been of more than an hour's duration.

At one time there was a considerable effort directed toward use of accelerated electrons in lieu of electromagnetic radiation. The effort continued apace with e-beam direct writing and to some extent contributed to advances in electron optics and in resist chemistry. A particular line of endeavor was pursued in the United States, Germany and in Japan. (See *J. Vac. Sci. Technol.*, Vol. 12, No. 6, Nov./Dec. 1975, "Electron-projection Microfabrication System"; *J. Vac. Sci. Technol.*, 16(6), Nov./Dec. 1979, "Aligned Multilayer Structure Generation by Electron Microprojection"; *Proceedings of the 11th Conference* (1979) *International) on Solid State Devices*, Tokyo, 1979; *Japanese Journal of Applied Physics*, Vol. 19 (1980) Supplement 19-1, pp. 47–50, "Demagnifying Electron Projection System".) This effort, which appears to have been most actively pursued in the late '70s, was generally directed to miniaturization beyond that thought to be offered by the then usual fabrication procedures. Reports are generally directed to minimum feature size at the $\sim 1$ $\mu$m to 0.5 $\mu$m level. Apparatus used represents a considerable degree of development and certainly demonstrates feasibility in terms of electron optics, registration and alignment, as well as of sources yielding adequate intensity and, therefore, reasonable exposure times.

The effort, for the most part, made use of absorbing masks (as then and now in use in visible and UV lithographic fabrication). The cited work makes use of self-supporting aperture masks although it was later suggested that a membrane-supported structure of the type used in X-ray fabrication could be substituted. (See *IBM Tech. Disclosure Bull.* (USA), Dec. 1977, Vol. 20, no. 7 pp. 2868–71, "Fabrication of E-beam Projection and X-ray Masks on a Support Frame".)

History shows that the major objective of the electron mask approach was satisfactorily met by lithographic delineation based on electromagnetic radiation of wavelength within the near UV spectrum. Literature study shows that efforts toward still smaller minimum feature size has concentrated on the electromagnetic radiation route as well (first deep UV and finally X-ray).

There has been little literature referenced to e-beam projection fabrication in recent times. It may be that chromatic aberration (and to some lesser extent elastic scattering) implicit in use of absorption masks explains emphasis on X-ray. As discussed in conjunction with FIG. 4, required thick absorption regions in conjunction with the (incomplete) nature of the absorption phenomenon itself, gives rise to electrons escaping from the edge of the absorbing region. Associated resolution limitation is a consequence of such electrons being improperly transmitted/blocked due to either of two mechanisms. Electrons as initially scattered or as misdirected due to reduced energy are improperly captured or excluded.

The history of conventional transmission electron microscopy is relevant to this discussion. Constant demand toward resolution of finer and finer features has been attended by design alterations. A consequence is very thin specimens as well as high accelerating voltages-both to expedite resolution of such small features. Both are attended by lowered absorption, by a degree of absorption inadequate to resolve features, and just as important, inadequate for replicating a grey scale needed for resolving detail within "blocking" regions. The now familiar solution to the problem is in a mode of electron microscopy known as "Scattering Contrast Transmission Electron Microscopy". This mode relies upon imaging as based upon the degree to which electrons experience scatter upon transmission through the specimen. Such imaging is dependent upon an apertured back focal plane filter. The principle of the operation is well known-unscattered electrons are selectively transmitted or blocked depending upon placement of the aperture. Replication of adequate grey scale is due to dependence of transmission on scattering angle.

SCTEM has been of undeniable significance but in turn presents certain problems not shared by conventional imaging based on absorption. A major problem has to do with aperture size. Conflicting design needs result from image contrast as implicitly dependent upon small aperture size which in turn limits feature size which may be resolved due to diffraction limitations. This led to enlarging of the aperture to result in reduced scattering contrast. As a consequence, new imaging methods, based for example on phase contrast, have emerged.

The history of electron microscopy is understood in terms of unavoidable specimen characteristics, e.g. contrast and size as discussed, together with required magnification typically to values $\geq 10,000$ (within a range of perhaps $100x - 10^6x$).

SUMMARY OF THE INVENTION

Device fabrication and resulting devices depend upon one or more lithographic projection procedures with capability of defining minimum size features of minimum dimensions 1 $\mu$m and below. Aspects of the invention entail submicron minimum feature size at or below 0.5 $\mu$m. Prospective devices described in the literature require a variety of minimum feature sizes, e.g. 0.35 $\mu$m, 0.25 $\mu$m, 0.2 $\mu$m and below. The invention is suitably applied to fabrication of such devices. Fabrication procedures entail image formation which is to some substantial extent affected by selective passage of lithographically defining energy dependent upon scattering during transmission through a mask.

An important class of such lithographic procedures depends on beam illumination of a mask containing a pattern defined by "blocking" and "transparent" regions which scatter transmitting illumination energy to respectively large and small extent so as to permit pattern replication on an image plane. Scattering-dependent transmission is by a filter—generally an apertured filter—which, relative to the object plane of the mask is on a "back focal plane" (defined as including equivalent conjugate planes) of the lens system. While not so limited, this back focal plane filter is usually absorbing (like other terminology used in this description the term "absorbing" means to a level which is lithographically significant—e.g. 100% absorption is not required if a lesser percentage is sufficient for the contemplated processing). Provision of a filter aperture which is on the optical axis of the lens system results in selective passage of unscattered energy—in selective passage of energy passing through transparent mask regions. A complementary system of providing for selective passage of scattered energy blocks passage through an on-axis region of the filter. Such a filter which selectively passes scattered energy may take the form of a central absorbing region surrounded by transparent material or by one or more apertures. Again, either filter in fact provides for passage or non-passage of energy depending upon range of scatter.

Appropriate lithographically defining energy must be of such nature as to be scattered or transmitted in the above terms by "blocking" and "transparent" regions of masks which are expediently manufactured and used (e.g. in terms of structural material and thickness). A variety of energy forms are suitable from this standpoint. Inventive significance is primarily in terms of energy of properties inherently suited to micron and submicron feature size definition. A preferred system relies upon electrons sufficiently accelerated for appropriate fine feature resolution. Specific discussion is in terms of acceleration within the 50–200 kV range. The inventive fabrication systems may result in product advantages as used with electromagnetic radiation energy e.g. in the X-ray spectrum as well.

Most significant near-term use of the invention involves patterning of resist materials. In general, delineating energy chosen for high resolution or low damage has little direct effect on device-functional properties of usual materials being processed. This is particularly true of an important category of processes which depend on electrons accelerated within the 50–200 kV range or higher. Such energized electrons are not locally absorbed within thin surface regions but penetrate to significant depths, sometimes completely through the article being fabricated. It is a feature of the invention that the very small concentration of damage-induced defects minimizes deterioration of device-significant characteristics.

Inventive species may, nevertheless, depend on direct or indirect change in device properties based on patterned illumination. One species involves simultaneous illumination and processing to result in illumination-dependent change in processing rate e.g. selective deposition as a consequence of decomposition or reaction selectively induced by illumination. Etch rate, too, may be affected positively or negatively by illumination.

The inventive approach enjoys marked advantages relative to X-ray fabrication—both in terms of proximity and projection printing. Imaging depends on differentiation between energy passing through absorbing and transparent mask regions. X-ray wavelengths appropriate to minimum feature size generally sought require blocking region in the mask of sufficient thickness to result in edge scattering resolution loss. Use of a back focal plane filter lessens resolution limitation due to edge scattering. Accordingly, use of the masking procedure of the invention is advantageous in X-ray and in other fabrication procedures dependent upon use of absorption-transmission masks as well. In this connection it is useful to note that the inventive approach may be of value in the fabrication of devices based on minimum feature dimensions which are satisfactorily addressed by other lithographic techniques. For example, even where such dimensions exceed 1 μm improvement in edge acuity inherent in the version of the invention selectively passing unscattered energy may be of consequence e.g. in expediting registration. Edge acuity values of 0.2 μm and 0.1 μm have been experimentally observed.

Suitable to contemplated submicron minimum features, the inventive approach may expedite in-situ processing. Imaging is carried out in an evacuated atmosphere. Subsequent procedures, development, material deposition e.g. by Molecular Beam Epitaxy, Chemical Vapor Deposition, etc. may be carried out without breaking vacuum.

BRIEF DESCRIPTION OF THE DRAWING

FIG. 4 is a diagrammatic view of a projection system suitably used with the invention.

DETAILED DESCRIPTION

1. Drawing

FIG. 1

Figure 1:
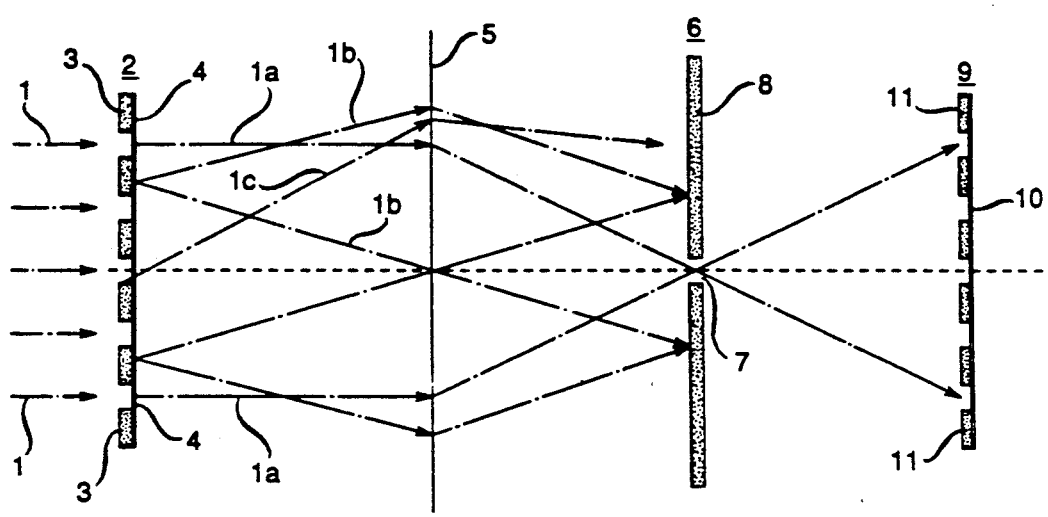
FIG. 1 is a diagrammatic view illustrating principle of operation of a back focal plane filter designed to selectively pass unscattered energy.
Figure 2:
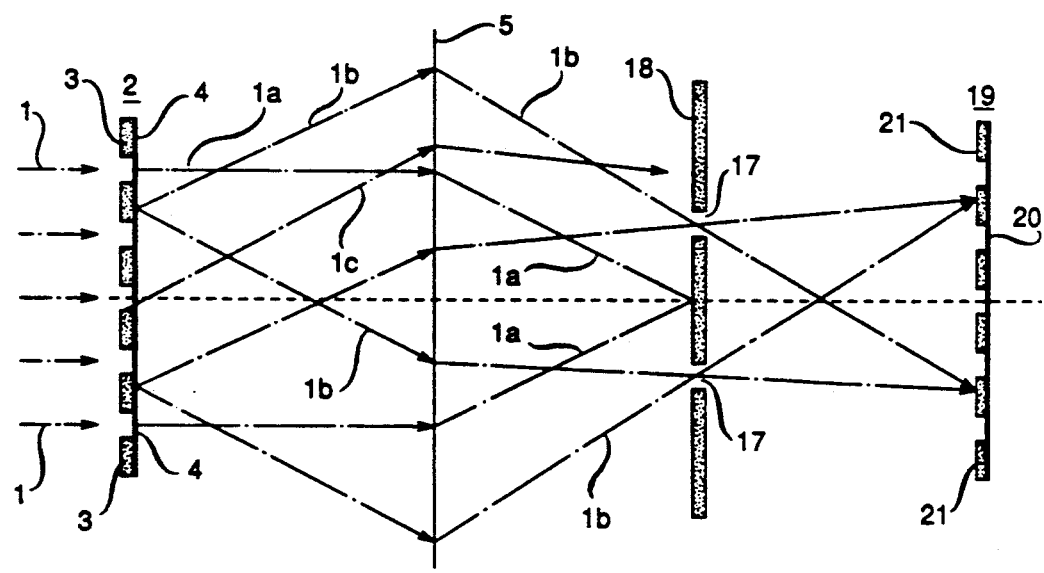
FIG. 2 is a diagrammatic view quite similar to that of FIG. 1 but illustrating principle of operation for the complementary system in which the back focal plane filter selectively passes scattered energy.

The single lens system depicted makes use of beam electrons, or other delineating energy, identified as rays 1 incident on mask 2 which includes blocking regions 3 and transparent regions 4. Rays transmitted through transparent regions 4, are identified as rays 1a while those transmitted by blocking regions 3 are identified as rays 1b. Such rays are refracted by lens 5 with emerging rays made incident on back focal plane filter 6. As schematically depicted rays 1a pass through filter aperture 7 to result in image 9 consisting of replicated illuminated regions 10 and unilluminated regions 11. Rays 1b scattered beyond a critical scattering angle, do not pass through aperture 7, but instead are absorbed or otherwise blocked by the non-apertured portion 8 of filter 6.

FIG. 2

The complementary system in which scattered energy is selectively used to form the image in this FIG. Here, scattered rays 1b pass through apertures 17 while transmitted rays 1a are now stopped by filter region 18. Image 19 a negative of image 9, results from selective illumination of regions 21. Regions 20 are unilluminated. In contemplated apparatus, the back focal plane filter is absorbing (although alternative designs may make use of forms of scattering such as Bragg scattering, etc.).

Rays 1c are depicted as energy scattered within a blocking region 3 so as to result in escape before complete transmission. The phenomenon is of very small amplitude for the version of the invention principally discussed—for the version which depends upon imaging based primarily on scatter-nonscatter masking. As considered in the description of FIG. 5, it is statistically more likely for thicker blocking regions such as are necessarily used for absorption-transmission masking.

As depicted, edge scattering of sufficient angle results in blockage by the back focal plane filter 6 in the same manner as for rays 1b. As later discussed, rays 1c may be due to simple elastic scattering or may be the consequence of one or more energy-absorbing events to result in inelastic scattering. Inelastic scattering, with its inherent energy reduction, results in chromatic aberration to add yet another influence statistically reducing likelihood of capture within the angle subtended by aperture 7, i.e. as due to lens dispersion (change in focal plane due to energy loss).

The implication is clear. Use of a back focal plane filter in conjunction with an imaging system dependent upon absorption nevertheless benefits by the inventive teaching. Edge resolution deterioration, limiting in absorption imaging projection systems, for electromagnetic radiation as well as for electron radiation, is alleviated.

FIG. 3

Data here presented, in the form of contrast curve 30 and transmission curve 31 is based on calculated values for an e-beam system. In this system, electrons accelerated to a level of 175,000 electron volts are made incident on a mask consisting of a 0.5 μm thick membrane of silicon oxynitride, supporting a 650 Å thick pattern of elemental gold. While such gold blocking regions serve the entirety of the lithographic function, an interposed 100 Å thick layer of chromium serves to assure adherence. Information of this form for the chosen radiation may be used to select appropriate operating property in terms of e.g. resist characteristics. (For a description of silicon oxynitride, a material familiar to many workers in this field, see "Thin Film Processes", edited by J. L. Vossen and W. Kern, Academic Press N.Y., 1978 pp. 299-300.)

FIG. 4

Apparatus 40 depicted in this FIG. includes electron or other energy source 41, condenser lens system 42, mask 43 consisting of blocking regions 44 and transparent regions 45, objective lens 46, back focal plane filter 47 shown as provided with on-axis aperture 48, projector lens system 49, exposure medium 50 shown as embraced by elements 51 and 52 which together constitute registration and alignment system 53. Apparatus 40 is completed by vacuum chamber 54 and air lock 55, the latter providing for specimen exchange.

The apparatus depicted serves as the basis for description of suitable optics. In these terms, it is to be contrasted with FIG. 1 which is intended solely as a schematic serving as basis for discussion of the fundamental principles involved. The apparatus of FIG. 4 has separate condenser and projector lens systems. This is preferred to facilitate focussing with minimum mechanical adjustment. Physical movement of the mask or the device in process, while certainly feasible increases apparatus cost and is likely to result in a time penalty as well. There is a further preference for multiple lenses in the projector system. For example, use of three lenses is useful to allow correction for image distortion and other aberrations, and to control image rotation as well. (See M. B. Heritage: Electron-projection microfabrication system, *J. Vac. Sci. Technol.*, Vol. 12, No. 6, Nov./Dec. 1975, pp. 1135-1139.)

Many workers concerned with lithographic fabrication at minimum feature size of 1.0 μm and below have considered reduction systems. Mask quality is improved and one contribution to image deterioration is lessened. The advantages must be balanced against resulting disadvantages. For example, effect of radial drop-off in intensity, particularly for electron illumination, is aggravated by use of larger masks. For present state of development, this may require step-and-repeat.

Equipment design permits image enlargement, as well as reduction and 1:1. While generally disadvantageous for the reasons discussed above, other circumstances may suggest the approach. Masks based on naturally occurring patterns—perhaps of atomic dimensions—may require enlargement.

Mask 43 is shown with the blocking regions 44 constituting the pattern on the underside of the membrane relative to the electron source. This is preferred due to the "top-bottom" effect. (See "Transmission Electron Microscopy: Physics of Image Formation and Microanalysis", L. Reimer, published by Springer-Verlag 1984, pp. 172-176.)

Reference to M. B. Heritage, cited above, is illustrative of the state of development of electron optics. In general, lens and other design parameters are quite advanced. Little change in design is suggested by substitution of scattering type masks in accordance with a preferred form of the invention.

FIG. 5

Figure 5:
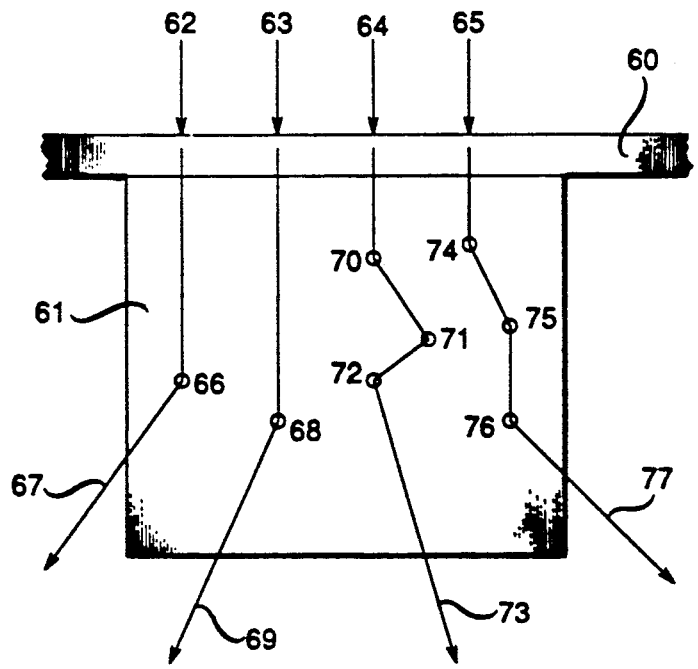
FIG. 5 is a diagrammatic view showing some types of scattering experienced within a blocking mask region. The FIGURE is intended to illustrate effects of elastic as well as inelastic scattering to result in energy which is "edge scattered" or which is scattered as exiting from the underside of the region.

FIG. 5 is a cross sectional view of a mask portion including membrane 60 supporting blocking region 61. The purpose of this FIGURE is to serve as basis for discussion relating to the various phenomena which may be experienced by lithographically defining energy within the blocking region.

Reference is made to four energy rays as made incident on membrane 60 to be transmitted into blocking region 61. Ray 62 experiences a single scattering event 66 to result in edge scattered ray 67 shown as escaping blocking region 61. Event 66 may be elastic or inelastic. Ray 63 also experiences but a single scattering event 68 to result in ray 69 exiting after transmission through the entire thickness of blocking region 61. Event 68, like 61, and like other events depicted in this FIGURE may be elastic or inelastic. Ray 64 experiences three scattering events, 70, 71, 72, to result in ray 73, like 69 exiting at the underside of blocking region 61. Ray 65 also experiences multiple scattering events, 74, 75, 76, to result in edge scattered ray 77.

Rays 69 and 73 are illustrative of scattered energy rays likely to play a role in various forms of the invention. The experience of ray 63 is illustrative of the phenomenon upon which scatter-nonscatter imaging of the invention is dependent. In this form of the invention, material and thickness of blocking region 61 are chosen to favor a small number of elastic collisions. Statistical assurance of image-significant degree of scatter may take the form of design providing for three collisions as depicted for ray 64. This statistical assurance is consistent with a blocking region which is thin relative to that needed for absorption masking. Thin blocking regions, desirable from the standpoint of fabrication, temperature stability, etc. inherently lessen likelihood of edge scattering as depicted for rays 62 and 65.

As discussed in conjunction with rays 1c of FIG. 1, edge scattering, as occurring in blocking regions dependent upon absorption, is likely to be due to inelastic collisions. Energy loss, the consequence of partial absorption, reduces the energy level of the radiation (in the instance of electron irradiation results in decreased velocity) to result in chromatic aberration. As discussed, frequency dispersion characteristics of the lenses constituting the optic system dictate direction change to result in such radiation being shifted on the image plane. In general, chromatic aberration increases the likelihood that affected energy will not be captured within the angle subtended by an on-axis filter aperture.

2. General

The inventive advance is properly discussed in terms of fabrication of devices—devices of interest for their operating characteristics based e.g. on small minimum feature dimensions and high packing density as well as for their cost based on throughput, yield, etc. Many of the fabrication procedures are at an advanced state of development. Electron beam direct write fabrication procedures use resists, registration techniques and other procedures which may be transferred directly for use in e-beam projection systems of the invention. The same is true of procedures using other forms of lithographically defining energy. X-ray, while most advanced in terms of proximity printing, is under extensive study for use in projection systems. Again, X-ray resists, registration techniques, etc. are known. Ultraviolet projection systems, both in the near UV and the vacuum UV spectra, are in use or under development.

The single feature common to all aspects of the invention is selective passage of transmitted lithographic energy as dependent on angle of scatter introduced by the mask. The back focal plane filter serves this function regardless of the form of transmitted energy and, as indicated, may selectively pass either (1) unscattered energy or (2) scattered energy—perhaps as based on degree of scatter as well. For most purposes, selective passage of unscattered energy is the preferred approach, since it inherently blocks transmission of energy which is edge-scattered.

From a functional standpoint, the back focal plane filter, if designed to selectively pass unscattered energy, is provided with an aperture located on the optical axis of the lens system. In general, the filter element is constructed of absorbing material and depends upon this characteristic for blocking (in this instance for blocking scattered energy). Heating, particularly uneven heating, may be of serious consequence in causing shifting or distortion of the aperture, and to this end, cooling and/or heat sinking may be provided. The problem is alleviated by horizontal disposition of the filter and by other precautions which maintain uniform temperature about the aperture.

Design principles for the filter are known (and are regularly used scattering contrast transmission electron microscopy). Design, largely in terms of aperture diameter, is simply with the objective of selective passage of energy based on scattering angle, however with a view to the inventive objectives.

A feature of the scattering-nonscattering version of the invention; that of reduced need for heat dissipation in the mask, places a further responsibility on the filter. Heat dissipation perhaps $\geq 5$ watts is readily dissipated at least in the filter provided with an on-axis aperture. Unlike the mask, it is practical to construct the filter of relatively thick material of high thermal conductivity (e.g., of copper or other metal).

Mask

Masks suitable for use in the invention invariably depend upon transparent regions which impart a sufficiently small degree of scatter to permit selective passage or blockage by the back focal plane filter. An important design consideration for the mask depends upon the observation that aperture size adequate for needed resolution may be large as compared with that needed for the far greater demand of usual transmission electron microscopy. This observation gives rise under many circumstances to transparent regions of thickness sufficient for masks which are both self-supporting and of sufficiently stable dimensions for most demanding circumstances—all compatible with expediently short exposure times for available and expected resists. Experimentally, membrane thickness of 0.3 $\mu$m and 0.7 $\mu$m have been shown to be sufficiently transparent to 100 kV and 175 kV electrons respectively to result in contrast of 70%–95% for a scatter-non-scatter system dependent upon gold blocking regions of 650 Å thickness.

In general, inventive processes depend upon "thin masks" by which is intended masks having transparent regions which are no more than 1 $\mu$M in thickness (ordinarily this translates into a supporting membrane of that thickness). Precise thickness depends upon a number of factors, primarily the nature of the membrane material and of the radiation energy. The mean-free path for 100 kV electrons in $Si_3N_4$ is about 600 Å. Desire for structural stability leads to a preference for membrane thickness of the order of 10 Å (of a thickness permitting 10 scattering events) and to a maximum permissible thickness of ~30 Å. (See "Transmission Electron Microscopy..." cited above at pp. 8–11, 138.) Description is here in terms of relatively low scattering angle membrane material as supporting relatively high scattering angle blocking material. In general terms, such criteria assure contrast of a degree necessary for available resist materials. Silicon oxynitride as used experimentally is illustrative of materials meeting such criteria.

Other types of masks are described in the technical literature. Work reported in *J. Vac. Sci. Technol.*, Vol. 12, No. 6, (1975) p. 1135 et sec. describes an electron beam projection system which relies on a self-supporting foil mask.

Reduced need for heat dissipation as compared with that required for absorption masks is realized by use of the scattering-nonscattering approach. For example, at a current density of $1 \times 10^{-5}$ Amp/cm$^2$, absorbed power in the mask is of the order of 0.001 watt/cm$^2$ (or by contrast, assuming the same resist exposure needs, an absorbing mask would require dissipation of ~1 watt/cm$^2$).

Electrical charging is unlikely to be a serious problem at least for a scattering-nonscattering mask. If necessary, the mask may be coated with a low atomic number electrical conductor such as amorphous carbon with little effect on lithographic properties.

Taking advantage of the mask:image reduction mode, it is possible to avoid direct write in mask fabrication. 10:1 reduction permits use of conventional electromagnetic (UV) mask fabrication for attainment of 0.2 $\mu$m minimum features in the image plane.

Lithographic Defining Energy

Figure 3:
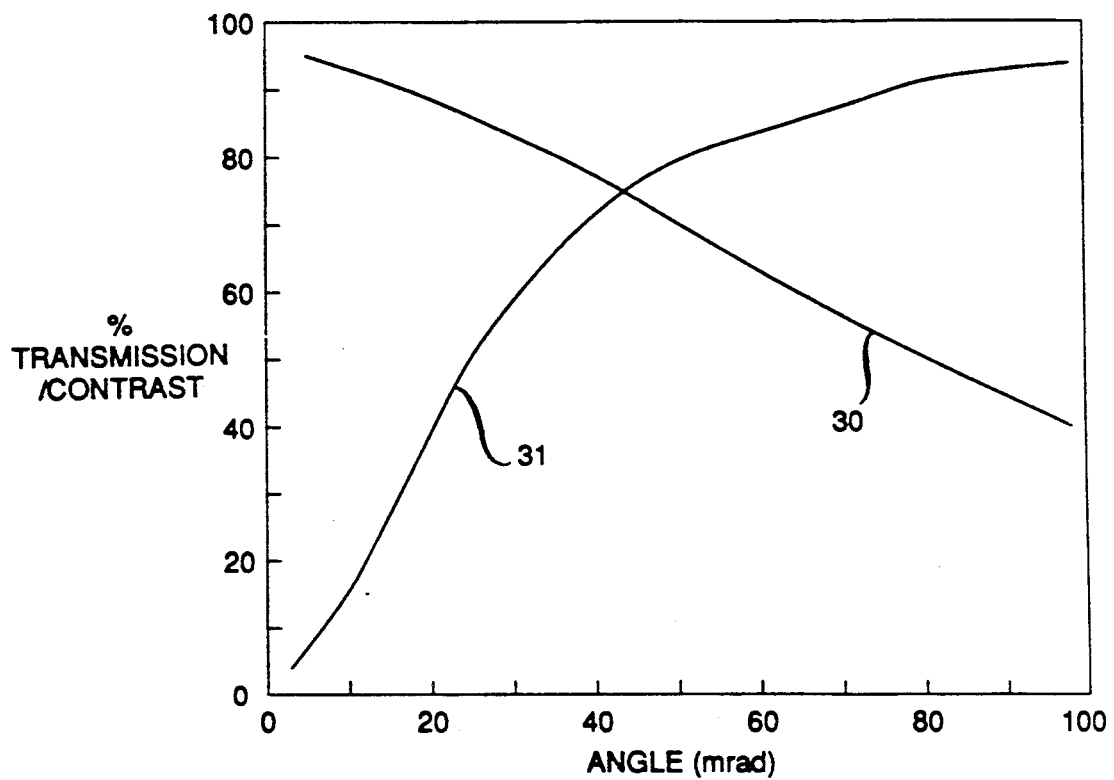
FIG. 3 on ordinate units of contrast and transmission and abscissa units of angle, relates the two ordinate quantities to acceptance angle of a back focal plane filter designed to selectively pass energy transmitted through the "transparent" mask regions.

FIG. 3 is based on 175 kV electrons. Other experiments suggest an electron energy range of up to at least 200 kV as suitable for use in ~0.2–0.35 $\mu$m fabrication (minimum feature size). Substantially lower energies (below ~50 kV) while sometimes suitable may be resolution limiting for such minimum feature size. Substantially higher energies are generally unnecessary, at least over this contemplated feature size range, so that increased expense entailed may not justified.

Available electron sources already meet many contemplated process needs. In terms of present day chip fabrication and assuming simultaneous illumination of the entire chip, the electron source should have capability both in terms of intensity and uniformity to illuminate a 2 cm $\times$ 2 cm chip. These conditions are attainable. For example, a hairpin tungsten filament emitter in a typical 100 kV transmission electron microscope gun can deliver a total emission current of about 100 $\mu$A, implying a current density of $2.5 \times 10^{-5}$ cm$^{-2}$ on a $2 \times 2$ cm image area. With PMMA resist at 100 kV accelerating voltage, exposure should be achieved at this current density in <100 seconds. In a following section reference is made to e-beam resist noting sensitivities as well as resolution characteristics.

Higher intensity sources are available. Large area thermionic emitters used in electron beam welding delivers emission currents of 0.5 Amp and above. As combined with more sensitive resists it is unlikely that contemplated systems will be limited by exposure time. Throughputs of 40 wafers per hour are permitted. Larger throughput is limited by other considerations— e.g. specimen exchange and registration.

Presently available resists offer values of latitude and contrast to accommodate characteristics offered by electron sources. Brightness variations, both time-dependent and position-dependent, of ~10% are expected to meet typical system/resist requirements. Effective position nonuniformity may be reduced by vibrating the beam during exposure. Electromagnetic or electrostatic deflection systems are suitable for this purpose.

Electron illumination should be sufficiently parallel and perpendicular (of sufficient telecentricity) so as not to limit resolution. This translates into tolerable angular deviation of ~1 mrad and is achievable.

Imaging Apparatus

Characteristics have been generally discussed in conjunction with FIGS. 1 and 4. With the exception of criteria relating to selective transmission based on scatter angle, requirements are well-known. Technical papers on projection e-beam systems include *J. Vac. Sci. Technol.* Vol. 12, No. 6, p. 1135 et sec., Nov./Dec. 1975, *J. Vac. Sci. Technol.* 16(6), Nov./Dec. 1979 cited above, and *Proceedings of the 11th Conference* (1979) *International) on Solid State Devices*, Tokyo, 1979 cited above. While these systems depend upon absorbing masks they go into considerable detail with regard to design of the elements depicted in FIG. 4. Systems for use with UV (both near UV and vacuum UV) are in commercial use or at an advanced stage of development. (See "Semiconductor Lithography Principles Common Practices and Materials", by W. M. Moreau, Plenum Press, N.Y., 1988.

A recognized deficiency in electron optics results in significant image distortion and aberrations. Image distortion aberrations are not only inevitable at this time but vary considerably from lens to lens. Distortion and aberrations in multi lens systems may be lessened by use of compensating lenses, but remain a problem for submicron lithography. The recommended approach is to use a single projection apparatus for all delineation-dependent processing of each device. It may even be useful to print all members of a mask set in a single apparatus (particularly for fabrication of 1:1 mask sets). In this way, it is possible to locally register chip features to sufficient accuracy even though the pattern is distorted overall.

The text, *ACS Symposium Series, Introduction to Microlithography*, ISSN 0097-6156;219 (1983) contains an excellent survey of resist compositions, and lithographic processing. The text, "VLSI Technology", edited by Sze, McGraw-Hill, Auckland, 1985. is illustrative of technical material pertaining to device fabrication.

Imaging Material

As discussed, important forms of the invention depend on resist imaging sensitive to accelerated electrons or electromagnetic energy. The following discussion is largely in terms of accelerated radiation but generally applies to other resists and to direct processing.

Manufactures describe resists as requiring a specified dose. For electron resists, dose is in units of microcoulombs/$cm^2$. The value assigned is generally that required for "large" area exposure, e.g. 10 $\mu m \times$ 10 $\mu m$. The explanation is the form of measurement required to determine thickness of affected areas. In general, measurement equipment requires such an area. Experience dictates that fabrication based on the micron or submicron features of the invention requires about twice the specified dose (due to lessened on proximity effect).

For positive resists, the minimum dose, as ordinarily specified, is that required to result in clearing in exposed regions generally with little or no loss of thickness in unexposed regions. For most purposes, retention of 70%-80% of unexposed thickness is sufficient and is within the manufacturer specifications.

For negative resists, the minimum dose specified ordinarily provides for retention of ~50% film thickness in exposed regions.

Contrast characteristics of commercial resists are specified, sometimes graphically on coordinates of contrast percent and dose. The form of the curve is ordinarily of near-horizontal small slope for low dose, then of sharply increased slope over the region of usual exposure conditions and finally near-horizontal at the saturation level.

Two technical papers are suitably referenced as describing state of the art resist compositions—particularly for e-beam use. (See *Solid State Technology*, "Forefront of Research on Resists", M. J. Bowden, June 1981 pp. 73-87 and *Ann. Rev. Mater. Sci.*, "Polymer Materials for Microlithography", 1987 pp. 237-269.) From this and other information, it is found that a variety of negative and positive tone resists suitable for use in the inventive processes are available or under development. Illustrative commercially available resists with resolution of at least 0.25 $\mu m$ include the negative tone Chloro Methyl Styrene and the positive tone N ovalac Positive Resist.

EXPERIMENTAL RESULTS

While characteristics implicit in the description thus far are calculable either on the basis of reported specifications or on the basis of physical principles, experiments were conducted for confirmation. As in much of the discussion thus far, reported work is sufficient to establish suitability of needed characteristics for the purposes of the invention. The preferred inventive approach, entailing accelerated electrons, is not so well founded. Experiments were largely conducted with a view to confirming such characteristics as applied to electron lithography.

Values of accelerating voltage required to produce inception of damage in usual semiconductor materials is set forth in the literature. Two mechanisms are of prime importance; ionization damage, and momentum transfer damage ("knock-on damage"). It is inherent in the use of the relatively high accelerating voltages that the first mechanism is likely of reduced device-consequence. Ionization damage is distributed through a greater penetration depth so that damage density is reduced, likely below levels of device consequence. To some extent, such damage may be expected to occur at depths below device-functioning material.

The second damage mechanism is characterized by a threshhold in energy (by a threshhold in accelerating voltage). Threshhold values are known. The value reported for silicon is ~190 kV—for the compound semiconductors, III-V, II-VI, and higher order materials, threshhold values are generally somewhat higher due to higher mass. Accordingly, experiments conducted and showing feasibility of accelerating voltages at or below such threshhold values are of significance. In reporting this work, it is not intended to limit the invention in these terms—such inception of damage is normally of little or no device consequence. As noted, use of accelerating voltages substantially above the threshhold values may be designed to take advantage of effects associated with damage.

Experiments have been conducted to establish feasibility in terms of radiation dose required for available resist materials. Again, in the instance of electron radiation such values are well known in terms of direct write (generally utilizing accelerating voltages of ~20–30 kV). The projection lithographic approach of the invention benefits by the improvement in resolution resulting from use of higher acceleration. Experiments were therefore directed to the dose dependence on accelerating voltage. One set of experiments dealt with Poly Methyl MethacrylAte, the positive tone e-beam resist commonly used in most demanding direct write fabrication. It was found that increasing accelerating voltage from 25 kV to 200 kV resulted in a needed dose increase of about 10×. Reference to a textbook and technical papers above establishes availability of an array of available as well as emerging resists, many of substantially greater sensitivity than that of PMMA.

Mask feasibility has been established. Membrane thicknesses, e.g. in the range 0.25–0.7 μm depending on supported elemental gold blocking regions well below 0.1 μm in thickness as exposed to incident electron radiation accelerated by 100 kV and 175 kV produced images of adequate resolution and contrast. The form of data presented in FIG. 3 was calculated on the basis of theory. Experimental data is consistent. Experimentally determined transmission/contrast values of 80%–10%/60%–90% in the terms reported corresponded to aperture angles in the range up to ~80 mrad.

Experiments conducted at 175 kV, using a back focal filter aperture subtending an angle of 15 mrads, have been used to resolve images with edge acuity of ~100 Å. Tone reversal in the image was achieved by shifting the back focal plane aperture from on axis to ~20 mrads off the axis. The contrast for the image was approximately 90% on axis. While not measured, the complementary image appeared to have about the same contrast.

We claim:

1. Method for device fabrication comprising at least one lithographic delineation step comprising projection of patterned radiation on an imaging material by means of a lens system to produce a pattern image, in which a mask is illuminated by radiation to result in transmission of said patterned radiation, characterized in that the transmission path of said patterned radiation includes a "back focal plane filter" defined as positioned on the back focal plane or some equivalent conjugate plane of such lens system, said filter including two types of filter regions, one of which, is relatively transparent to said patterned radiation, and defines the pass portion of said filter, said filter serving to block transmission of a part of said patterned radiation dependent upon degree of scatter as imposed by said mask, in which the said mask includes two types of mask regions which produce different degrees of scattering on illuminating radiation so that said patterned radiation is pattern-defined by such degrees of scattering, in which the said radiation consists essentially of accelerated electrons, in which the electrons are accelerated to within a range of from 50 to about 200 kV.

2. Method for device fabrication comprising at least one lithographic delineation step comprising projection of patterned radiation on an imaging material by means of a lens system to produce a pattern image, in which a mask is illuminated by radiation to result in transmission of said patterned radiation, characterized in that the transmission path of said patterned radiation includes a "back focal plane filter" defined as positioned on the back focal plane or some equivalent conjugate plane of such lens system, said filter including two types of filter regions, one of which, is relatively transparent to said patterned radiation, and defines the pass portion of said filter, said filter serving to block transmission of a part of said patterned radiation dependent upon degree of scatter as imposed by said mask, in which the said mask includes two types of mask regions which produce different degrees of scattering on illuminating radiation so that said patterned radiation is pattern-defined by such degrees of scattering, in which the said radiation consists essentially of electromagnetic radiation.

3. Method of claim 2 in which the said electromagnetic radiation is in the X-ray spectrum.

* * * * *